(12) United States Patent
Li

(10) Patent No.: US 10,468,227 B2
(45) Date of Patent: Nov. 5, 2019

(54) CHARGED PARTICLE SOURCE

(71) Applicant: Hermes Microvision, Inc., Hsinchu (TW)

(72) Inventor: Shuai Li, Fremont, CA (US)

(73) Assignee: HERMES MICROVISION, INC., Hsinchu (TW)

( * ) Notice: Subject to any disclaimer, the term of this patent is extended or adjusted under 35 U.S.C. 154(b) by 0 days.

(21) Appl. No.: 16/042,871

(22) Filed: Jul. 23, 2018

(65) Prior Publication Data

US 2019/0057833 A1   Feb. 21, 2019

Related U.S. Application Data

(60) Continuation of application No. 15/404,618, filed on Jan. 12, 2017, now Pat. No. 10,032,600, which is a
(Continued)

(51) Int. Cl.
*H01J 37/143* (2006.01)
*H01J 37/28* (2006.01)
(Continued)

(52) U.S. Cl.
CPC ............. *H01J 37/143* (2013.01); *H01J 3/20* (2013.01); *H01J 37/063* (2013.01); *H01J 37/065* (2013.01); *H01J 37/09* (2013.01); *H01J 37/14* (2013.01); *H01J 37/28* (2013.01); *H01J 2237/0453* (2013.01);
(Continued)

(58) Field of Classification Search
USPC .................................................... 250/396 R
See application file for complete search history.

(56) References Cited

U.S. PATENT DOCUMENTS 5,371,371 A * 12/1994 Yamazaki ............. H01J 37/073
250/396 ML
5,548,183 A   8/1996 Miyoshi et al.
(Continued)

FOREIGN PATENT DOCUMENTS

WO   WO 2005/124815   12/2005
WO   WO 2008/120341   10/2008
WO   WO 2010/134259   11/2010

OTHER PUBLICATIONS

Cheng et al. "Study on wide beam curved optical axes focusing for magnetic immersed lenses without crossovers", Optik 111, No. 1, (2000) 509-513, Department of Electronics Science and Technology, School of Electronics and Information Engineering, Xi'an Jiaotong University, Xi'an, China.
(Continued)

*Primary Examiner* — Phillip A Johnston
(74) *Attorney, Agent, or Firm* — Finnegan, Henderson Farabow, Garrett & Dunner, LLP

(57) ABSTRACT

This invention provides a charged particle source, which comprises an emitter and means of generating a magnetic field distribution. The magnetic field distribution is minimum, about zero, or preferred zero at the tip of the emitter, and along the optical axis is maximum away from the tip immediately. In a preferred embodiment, the magnetic field distribution is provided by dual magnetic lens which provides an anti-symmetric magnetic field at the tip, such that magnetic field at the tip is zero.

13 Claims, 14 Drawing Sheets

Related U.S. Application Data division of application No. 14/964,221, filed on Dec. 9, 2015, now Pat. No. 9,799,484.

(60) Provisional application No. 62/089,609, filed on Dec. 9, 2014.

(51) Int. Cl.
| | |
|---|---|
| *H01J 3/20* | (2006.01) |
| *H01J 37/063* | (2006.01) |
| *H01J 37/065* | (2006.01) |
| *H01J 37/14* | (2006.01) |
| *H01J 37/09* | (2006.01) |

(52) U.S. Cl.
CPC . *H01J 2237/063* (2013.01); *H01J 2237/0653* (2013.01); *H01J 2237/06308* (2013.01); *H01J 2237/06375* (2013.01); *H01J 2237/083* (2013.01); *H01J 2237/141* (2013.01); *H01J 2237/1415* (2013.01); *H01J 2237/2806* (2013.01); *H01J 2237/2817* (2013.01)

(56) References Cited

U.S. PATENT DOCUMENTS

| | | | |
|---|---|---|---|
| 5,895,919 A | 4/1999 | Frosien et al. | |
| 6,069,363 A | 5/2000 | Golladay | |
| 6,392,333 B1 | 5/2002 | Veneklasen et al. | |
| 6,642,525 B2* | 11/2003 | Kienzle | H01J 37/1474 250/396 ML |
| 7,372,195 B2 | 5/2008 | Coyle et al. | |
| 7,705,298 B2 | 4/2010 | Liu | |
| 7,821,187 B1 | 10/2010 | Jiang et al. | |
| 7,893,406 B1 | 2/2011 | Zhang et al. | |
| 7,960,703 B2* | 6/2011 | Goto | B82Y 10/00 250/396 ML |
| 8,921,804 B2* | 12/2014 | Frosien | H01J 37/067 250/310 |

OTHER PUBLICATIONS

Tang et al. "A new approach for evaluating the current and charge density distributions in electron guns and beams", Optik 116, (2005) 185-193, Department of Electronic Science and Technology, Xi'an Jiaotong University, Xi'an, China.

Saito et al. "A new design for a field emission electron gun immersed in a magnetic-lens field", Proceedings of SPIE, vol. 2522 (1) SPIE—Sep. 25, 1995. NTT LSI Laboratories, Japan.

Delong et al. "A new design of field emission electron gun with a magnetic lens", Optik, vol. 81, 1989, pp. 103-108, Institute of Scientific Instruments of the Czechoslovak Academy of Sciences, Brno, CSR.

* cited by examiner

CHARGED PARTICLE SOURCE

CLAIM OF PRIORITY

This application is a continuation of application Ser. No. 15/404,618, filed Jan. 12, 2017, which is a division of application Ser. No. 14/964,221, filed Dec. 9, 2015 (now U.S. Pat. No. 9,799,484), which claims the priority of U.S. provisional application No. 62/089,609, filed Dec. 9, 2014 and entitled "Dual Magnetic Condenser Lens for Electron Gun", all of which are incorporated herein by reference.

FIELD OF THE INVENTION

The invention relates to a charged particle source for inspection. The invention also relates to an electron source with an electron beam control apparatus that can provide higher angular beam current, high spatial resolution, and improvement of throughput for the inspection process of scanning electron microscope. However, it would be recognized that the invention has a much broader range of applicability.

BACKGROUND OF THE INVENTION

Undoubtedly, compared to any other technology or knowledge, semiconductor devices not only impact nowadays society but also influence our daily life. Although it can be traced to two centuries ago, for example Alessandro Volta in 18th century and Michael Faraday in $19^{th}$ century, the history of semiconductor development indeed influences mankind in commercial semiconductor devices is $20^{th}$ century. In the first, vacuum tube transistor is replaced by the semiconductor devices which mainly include BJT (Bipolar Junction Transistor) and MOSFET (Metal-Oxide-Semiconductor Field Effect Transistor), and then the semiconductor devices are minimized into integrated circuits. No matter digital logic circuit device, analog circuit device or communication devices, these semiconductor devices can be fabricated on silicon-based substrate or semiconductor compound substrate. Another semiconductor devices are photoelectronic devices which mostly include LED (Light Emitting Diode), LD (LASER Diode) or photovoltaic cell base on photoelectric effect. Currently, digital electronic devices based on MOSFET fabricated in silicon substrate are commercially the most significant, and the applications of the devices are processors and memory devices.

Fabrication processes for manufacturing ICs in the silicon substrate include cleaning process, oxidation and thermal process, ion-implementation process, thin film deposition, lithography, etching process and CMP (Chemical Mechanical Polishing) process. By the combination of the above processes, when all electronic devices are formed in the substrate, and then followed by metallization process to electric connect all electronic devices, a specific application device, such as CPU, ASIC, FPGA, DRAM, or Flash, can be produced. With the technology progress of semiconductor process, the smaller width of an electronic device followed by Moore's law which means transistors are doubled every 24 months, the more devices in one wafer can be fabricated to cost down.

The semiconductor fabrication processes include ion implantation process, thermal process, thin film deposition process, etching process, CMP (Chemical Mechanical Polishing) process, lithography, and cleaning process. And they will be briefed hereinafter.

Ion-implantation process will direct group III or group V atoms implanted into silicon substrate to alter local electric conductivity such that some regions are positive conductivity and some regions are negative conductivity. Phosphorus or Arsenic atoms are usually used for the negative conductivity, while Boron atom is usually used for the positive conductivity.

Thermal process provides formation of thermal oxide layer and annealing for drive-in after ion-implantation. In the present art, RTP (Rapid Thermal Process) is popular instead of conventional thermal process in furnace. It includes RTO (Rapid Thermal Oxidation) and RTA (Rapid Thermal Annealing) to respectively form silicon oxide and repair lattice damages after ion-implantation such that single crystal structure can be recovered and dopant can be activated.

Thin film deposition process includes PVD (Physical Vapor phase Deposition) and CVD (Chemical Vapor phase Deposition) to form several to several tens thin film layers with variant materials and thicknesses on silicon substrate. Metal layers, formed on a substrate, always provide electric interconnections among devices, while dielectric layer provides isolation between metal layers. Chemical reactions in vapor phase, happened to form thin films in CVD, include MOCVD (Metal-Organic CVD), APCVD (Atmosphere Pressure CVD), LPCVD (Low Pressure CVD), HPCVD (Hybrid Physical CVD), RTCVD (Rapid Thermal CVD), HDPCVD (High Density Plasma CVD), and PECVD (Plasma Enhanced CVD). Thin films forms by CVD usually include silicon oxide, silicon nitride, polysilicon, metal tungsten, metal aluminum, and metal titanium nitride. Metal target are heated or bombarded in vacuum such that atoms on the metal target can be transferred to substrate surface to form thin film in PVD, which includes evaporation and sputtering. Metal thin films, such as aluminum, titanium, or alloy thereof, are always formed by using PVD. Quality control of the thin film is critical to IC process, so thin film process must be monitored throughout the procedure to reflect abnormal, such that thickness uniformity and defect and be avoided.

Etching process, which includes wet etch and dry etch, is to remove material. In the semiconductor process, patterns on a reticle can be transferred to a thin film by using etch process. Wet etching is isotropic by reacting etchant to selective material, and etched profile always reveals bowl-like shape. Dry etch is popular and anisotropic by reacting plasma in an external electric field with the selective material, and etched profile will reveal vertical-like shape.

CMP is another method to remove material, which introduce slurry between publish pad and wafer with chemical and mechanical reactions to achieve whole wafer planation, such that thin films in the following process can be formed better. Silicon oxide layer, metal layer and polysilicon layer are most applied in the CMP process.

Lithography process, also named photo-lithography process, is the most critical in the semiconductor process, which includes PR (photo Resist) layer coating, soft bake, exposure, development, hard bake, and ash after etching process. The PR can be selectively removed through exposure and development, and circuit patterns can be transferred to a specific material. When the semiconductor process continues shrinking, available RET (Resolution Enhancement technology), such as OPC (Optical Proximity Correction), immersion lithography, and EUV (Extreme Ultraviolet lithography, are applied.

Cleaning process must be processed after all other process recited above to avoid uninvited particles or residues to impact device quality, which includes rinsing wafer by DI (De-Ionized) water and drying the wafer. Ultrasonic agitation can be applied in the cleaning process. This process will clean out all pollutions, such as particles, organic matter, inorganic matter, metal ions.

Defects are inevitably generated in the semiconductor process, which will greatly impact device performance, even failure. Device yield is thus impacted and cost is raised. Current defects can be classified into systematic defects and random defects in general. On the one hand, system defects infer defects will be found repeatedly and systematically in wafers, in which defect patterns can be used as reference in classification to determine root cause of which process incurs such defects. In order to increase semiconductor process yield, it is critical to enhance yield by monitoring, such as by using SEM (Scanning Electron Microscope), systematic defects highly appeared regions in mass production process to real time eliminate systematic defects. On the other hand, the non-systematic defects, random particle defects, are random residues left in wafers. Distributions and characteristic profiles are important references to distinguish systematic defects from non-systematic defects.

More specifically, systematic defects can be classified as reticle errors in alignment or machine offset, process mistakes incurred by recipes or materials, prober damages in wafer probing, scratches on wafer surface, and wafer edge effect of topography incurred from non-uniformity of PR coating or thermal stress.

The corresponding defects are recited hereinafter in brief. Defects incurred in lithographic process include PR residue defects due to PR deteriorated or impurity, peeling defects, bridge defects, bubble defects, and dummy pattern missing defects due to pattern shift. Defects incurred in etching process include etching residue defects, over-etching defects and open circuit defect. Defects incurred in CMP process include slurry residue defects, dishing defects and erosion defects due to variant polishing rates, scratched due to polishing. Further, when process nodes continue shrinking, new materials and processes will be introduced to inevitably incur new type defects. For example, because physical dimension of patterns are smaller than the optical resolution of the applied lithographic wavelength (193 nm), the critical dimension exposed on wafers may incur offset. Thinning defects are another inevitably incurred in the process node shrinking. In order to reduce RC delay in multi-layered interconnection structures, low-k dielectric layer and cupper material are introduced. Cupper can't be etched and hence damascene process is introduced that metal is filled into dielectric layer. Therefore, some other hidden defects are covered under layer, such as void defects, etching residue defects, over-etching defect, under layer particles, and via open incurred in the interconnection process. Such hidden, crucial defects are too hard to be analyzed and eliminated.

For the non-systematic defects are mainly random particles defect incurred from particles in air randomly fallen on the wafer, which are not easy to be identified and resolved.

In order to enhance semiconductor process yield, defects have to be identified as soon as possible to prevent from impact pouring out. Optical microscope is used in conventional optical inspection which includes bright field inspection and dark field inspection. Every die on a wafer is scanned by optical beam and images of every die are generated and stored. A die-to-die compare is used to identify if there is any abnormal or defect with locations and images thereof.

When semiconductor nodes continue shrinking, dimensions of defect shrink also. Unimportant small defects in previous now become critical therefore. It is a challenge to identify such small defects by using conventional optical inspection tool and a new tool is necessary. One method is to combine the operations of optical inspection and review SEM. Because of resolution, the optical inspection is not enough to meet requirement of identifying defects, but a suspect region in blurred images can be determined defect-like and reviewed by review SEM with high resolution. Thus defects can be identified and analyzed. Another method is to illuminate dual beams on a wafer surface to obtain interference patterns, and defect regions always have different interference pattern to that of the normal region. Thus, defects can be identified and further analyzed by review SEM. In practice, defects must be identified first and locations of the defects are forward to review SEM with high resolution to analyze defects.

However, in sub-20 nanometer semiconductor node, optical inspection tool can't reveal any pattern more, even by using interference method, and hence SEM is the only way to identify defects. Nevertheless, due to the detected signal electrons in the SEM are secondary electrons, detection duration inevitably retrogrades significantly compared to that of optical inspection. Hence, it is an important issue to fast identify defects on a wafer by using SEM. An ebeam inspection tool, based on SEM, is currently best solution for defect inspection.

The ebeam inspection tool is to find or identify defects in the semiconductor process, and relative to review SEM, a large FOV (Field-of-View) and large beam current are commercial means to enhance inspection throughput. In order to obtain large FOV, a SORIL (Swing Objective Retarding Immersion Lens) system is applied commercially. Moreover, resolution is sometimes lowered, compared to review SEM, enough to capture defects.

The ebeam inspection tool is designed different from the review SEM. The review SEM is designed to known, identified defects or suspects of defect, so scan duration is long enough to analyze or review defects, and hence it can't process inspection. On the other hand, the ebeam inspection tool, with high scanning rate than the review SEM and high resolution than the optical inspection tool, can identify defects that the optical inspection tool in no way to capture.

Furthermore, in lithographic process, some particular patterns may have great possibility to incur defects, but won't incur them each time. The defects generated by these particular patterns even can't be modified through recipe tuning or modifying reticle directly. Such a kind of patterns is named hot spot, and must be monitored in-line process.

Applications of SEM, except yield management tool of ebeam inspection and analysis tool of review SEM, may further be metrology tool in semiconductor manufacturing process; that is CD (critical Dimension)-SEM. CD-SEM will measure CD in a wafer with by line-scanning sample with moving stage to reveal process uniformity. Moreover, in order to obtain exact dimension, resolution is very critical, and thus low beam current must be applied.

Still another application of SEM is EBDW (E-Beam Direct Writer), or named EPL (E-beam Projection Lithography), still based on SEM. Purposes of EBDW are to expose a photoresist directly, and an etching step can be applied to transfer patterns to a sample after the photoresist is developed. In such a process, there is no reticle necessary, and patterns are written directly on the sample. Because wavelength of an ebeam is superior small than an optical wavelength, finer patterns, such as nano scale resolution, can be easily obtained.

For the ebeam inspection tool, beam current is always large enough to increase throughput. Moreover, in VC (Voltage Contrast) mode, defects can be identified only when enough large beam current is applied. However, large beam current always incurred some issues, such as lower resolution, larger aberration, and charging. In nowadays shrinking semiconductor node, it is necessary to provide a large beam current with higher resolution.

BRIEF SUMMARY OF THE INVENTION

The object of this invention is to provide a charged particle source with large beam and high resolution. A magnetic field distribution is provided that magnetic field is minimum or zero at the tip of the emitter and, along the optical axis, maximum away from the tip immediately. The magnetic field distribution can be provided by one magnetic lens or dual magnetic lens.

Accordingly, the invention provides a charged particle source, which comprises an emitter for providing a charged particle beam, and means for providing a magnetic field, wherein the magnetic field is minimum at a tip of the emitter, and the magnetic field along an optical axis of the charged particle beam reaches maximum immediately away from the tip.

The charged particle beam can be an electron beam, and the charged particle source may further comprise an extraction electrode for extracting electrons away from the emitter.

The present invention also provides an electron source, which comprises an emitter for providing an electron beam along an optical axis, upper means for generating a first magnetic field, and lower means for generating a second magnetic field, wherein the first magnetic field superposed by the second magnetic will provide zero magnetic field at a tip of the emitter and, along the optical axis, will reach maximum immediately away from the tip.

The electron source may further comprise an anode for extracting the electron beam away from the emitter, and may further comprise a suppressing electrode around the emitter. The upper means can be a first permanent magnetic attached to the suppressing electrode. The lower means can be a second permanent magnetic below the emitter or include an excitation coil encompassed by a yoke.

The present invention also provides a condenser lens system, which comprises a first magnetic lens above an electron source, and a second magnetic electron source below the electron source. When a first magnetic field generated by the first magnetic lens is anti-symmetric to a second magnetic field generated by said second magnetic lens at a tip of the electron source, a compound magnetic field superposed by the first and second magnetic field is weakest at the tip and largest immediately long an optical axis of the electron source, and the compound magnetic field provides a high resolution mode. When the first magnetic field generated by the first magnetic lens is symmetric to the second magnetic field generated by the second magnetic lens at the tip of the electron source, the compound magnetic field superposed by the first and second magnetic field is largest at the tip of the electron source, and the compound magnetic field provides a high throughput mode.

The weakest magnetic field at the tip of the electron source can be zero. The first magnetic lens includes a first excitation coil encompassed by a first yoke, and the second magnetic lens includes a second excitation coil encompassed by a second yoke. The condenser lens system may further comprise a vacuum tube encompassing the electron source and inside the first and second magnetic lenses.

The present invention also provides an electron beam tool, which comprises an electron source for providing an electron beam, the condenser lens system, an auxiliary lens for condensing the electron beam, an objective lens for focusing the electron beam on a sample, a scanning unit for scanning the electron beam on the sample, and a detector for receiving signal electrons emanated from the sample.

The electron beam inspection tool may further comprise a plat with a plurality of apertures between the condenser lens system and the auxiliary lens. The objective lens can be an immersion lens, and preferred SORIL system.

The present invention also provides a method for providing an electron source—which comprises steps of emitting an electron beam, along an optical axis, by an emitter, and generating a first magnetic field and a second magnetic field, wherein a superposed magnetic field by the first and second magnetic fields has a minimum magnetic field at a tip of the emitter, and, along the optical axis, a maximum away from the tip immediately.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1:
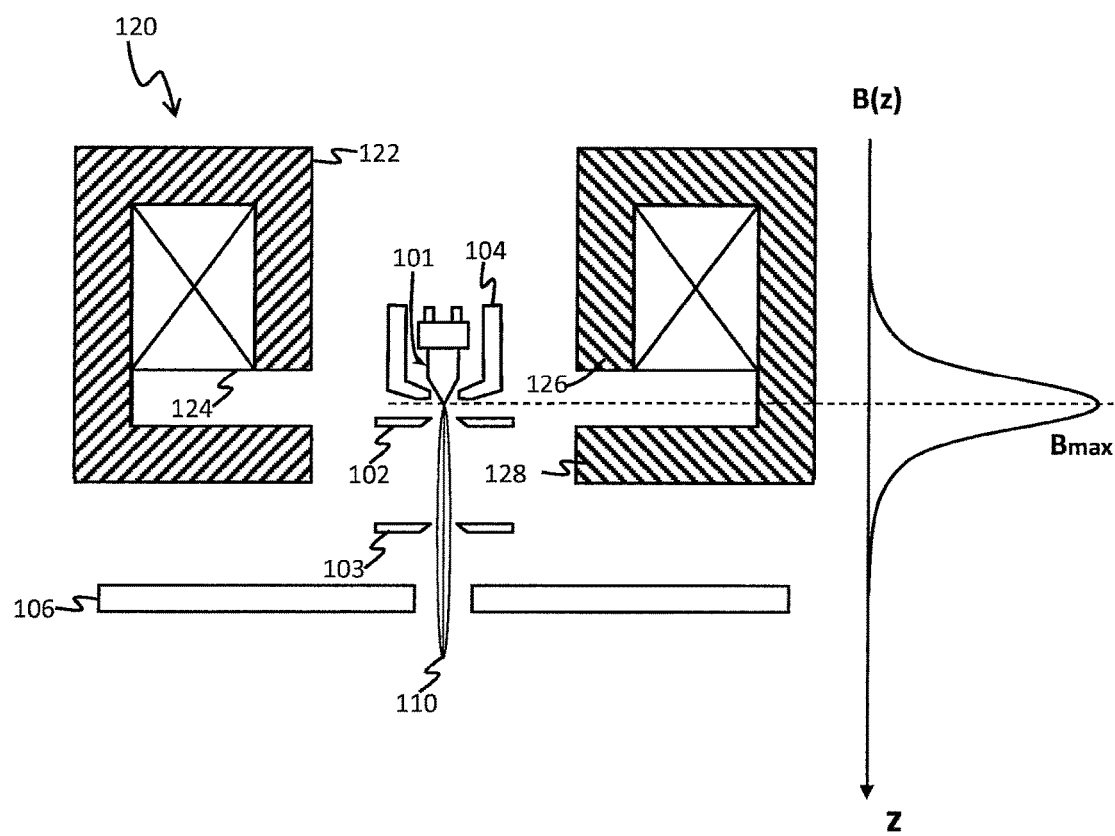
FIG. 1 is a prior schematic illustration of an immersion type electron gun, wherein an emitter is immersed an magnetic field.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

As used herein, the term "specimen" generally refers to a wafer or any other specimen on which defects of interest (DOI) may be located. Although the terms "specimen" and "sample" are used interchangeably herein, it is to be understood that embodiments described herein with respect to a wafer may configured and/or used for any other specimen (e.g., a reticle, mask, or photomask).

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

Turning now to the drawings, it is noted that the figures are not drawn to scale. In particular, the scale of some of the elements of the figures is greatly exaggerated to emphasize characteristics of the elements. It is also noted that the figures are not drawn to tie same scale. Elements shown in more than one figure that may be similarly configured have been indicated using the same reference numerals.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, "axial" means "in the optical axis direction of an apparatus, column or a device such as a lens", while "radial" means "in a direction perpendicular to the optical axis". Usually, the optical axis starts from the cathode and ends at specimen. The optical axis always refers to z-axis in all drawings.

The term, crossover, refers to a point where the electron beam is focused.

The term, virtual source, means the electron beam emitted from the cathode can be traced back to a "virtual" source.

The present invention relates to a charged particle source, especially to an ebeam source which can be applied to SEM, ebeam inspection tool, or EBDW. The ebeam source, in this art, also named ebeam (Electron Gun), is a critical index for generating a high luminance, high throughput, and low aberration. This invention provides an immersion ebeam source by changing magnetic field distribution.

The ebeam source includes an electron emitter and a lens set. The electron emitter or emitter includes a cathode, which is thermionization type in early stage. This type emitter constitutes with tungsten filament, applied by ten thousands voltage to increase temperature to about 2800K to overcome tungsten work function, such that electrons in the tungsten filament can escape from the filament to form thermion electrons. However, due the emission solid angle is very large, radius of the emitted electron beam and energy spread are very large, and aberration is hence incurred. Moreover, the temperature is too high such that raised power consumption, lower vacuum, lower emission rate, and decayed lifetime are incurred. Furthermore, the long-term high temperature operation will cause the tip of the filament deformation to deteriorate uniformity of the emitter electron beam. Another material of cathode, $LaB_6$, is provided to improve to above mentioned issues, but cost is increased. The field emission electron gun with low aberration, high emission rate, and high reliability is thus provided. Present field emission e-gun includes cold field emission type with single crystal W and Schottky type with ZrO/W, in which high voltage is applied to generated Schottky effect such that electrons can leave cathode by tunneling effect or overcoming energy barrier. Because the electrons will be emitted at the tip of the emitter, a very fine and bright high current density beam current can be provided. The operation temperature, compared to thermionization type, is low can hence life can be extended with lower power consumption. The cold field emission type possesses small radius of beam current and energy distribution due to tunneling effect, while, except small radius of beam current and energy distribution, the Schotty emission type possesses large beam current due to lower work function. The Schottky emission type is thus nowadays mainstream.

In order to further lower aberration of the electron source, an immersion type e-gun is developed in which the emitter is inunersed in a rotational symmetric magnetic field. The magnetic field, non-uniform field, is provided by a magnetic lens which can be composed of solenoidal coil or a permanent magnet. The immersion type e-gun is different to the conventional non-immersion type e-gun, because local electrons emitted will whirl along spiral trajectories around local magnetic force lines, instead of optical axis, to converge. Therefore, there will be no crossover formed and Coulomb compulsion effect is reduced. The magnetic lens is a pre-condenser lens to pre-condense the electron beam from the cathode. The effective angular intensity is hence increased and the emitted solid angle is reduced. The more electron beam close to optical axis, the more probe electron beam is increased, and larger beam current can be provided with less geometric aberration. The larger beam current, the more inspection throughput is, because the more probe ebeam spot scanned, the more signal electrons detected by the detector will be. Furthermore, the less time of ebeam staying in a point, the fast scan rate can be obtained. Such an immersion type electron source is applied to ebeam inspection tool based on LVSEM (Low Voltage SEM) in semiconductor manufacturing process.

Detail structure of the immersion type e-gun can be referred to FIG. 1, wherein a cathode 101, surrounded by a suppression electrode 104, emits an electron beam 110. An extraction electrode 102, below the cathode 101, extracting electrons from the cathode 101, and a lens electrode 103, below the extraction electrode 102, slightly converges the electron beam 110. An anode 106, below the lens electrode 103, is grounding to accelerate the electron beam 110 to a specimen. A magnetic lens 120, co-axial symmetrically surrounding the cathode 101, includes an excitation coil 124 covered by a yoke 122. The yoke 122, composed of magnetic conductive material, has an opening which provides upper pole piece 126 and lower pole piece 128 when the excitation coil 124 excites to generate magnetic field. The magnetic field distribution, along the optical axis, has a maximum Bmax at the tip of the cathode, which means the emitter 101 is immersion in the magnetic field.

The suppressor electrode 104 will provide a negative field to suppress electrons front side of the cathode 101 from large angular distribution electron beam. The electrons emitted from the cathode 101 will spiral in the immersion magnetic field and is converged to the optical axis. The extraction electrode 102, lens electrode 103, and the anode 106 configure an electrostatic lens to condense the electron beam 110. The electron beam 110 thus has a crossover below the anode 106. The crossover can be determined by tuning the excitation coil 124 and the lens electrode 103.

Figure 2:
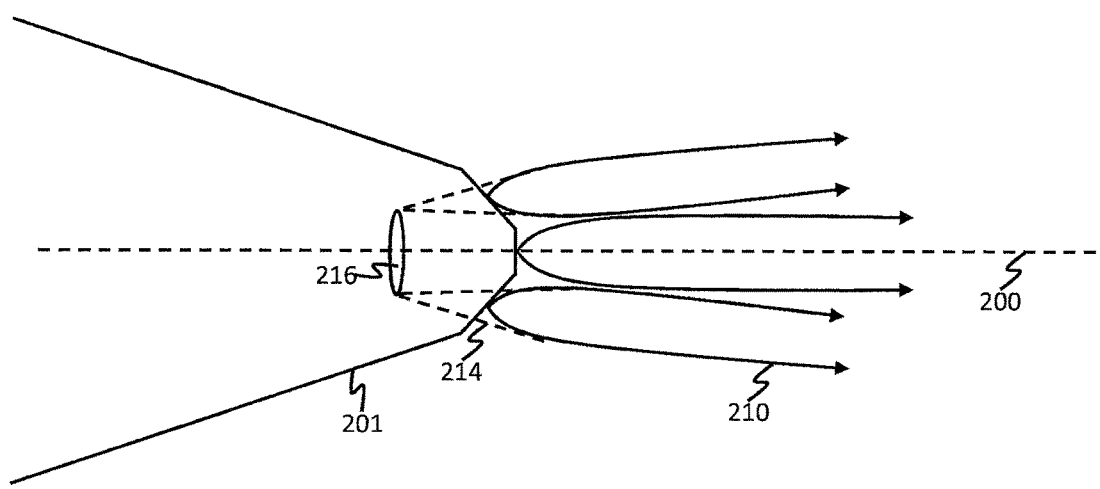
FIG. 2 illustrates that area of virtual source is enlarged due to emitter immersed in the magnetic field.
Figure 3:
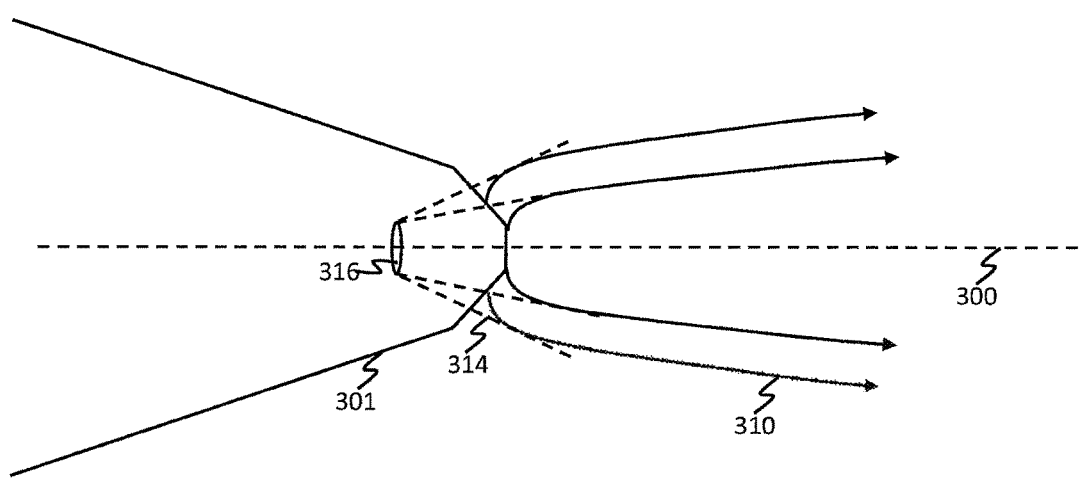
FIG. 3 illustrates that area of virtual source can be kept small due to electrons at the tip of the emitter is not immersed in the magnetic field.

Please refer to FIG. 2, detail structure of the cathode 101 of electrons emitted from the cathode 101 is illustrated. The electron beam 210 is emitted from the cathode 201 along the optical axis 200. However, the cathode 201 is immersed in the magnetic field, the maximum field, and the electrons emitted away from the surface of the cathode 201 will spiral along a local magnetic force line, not the optical axis 200. Please notice that only the electrons emitted at the optical axis 200 will spiral along the optical axis 200. The virtual source 216 this will have larger area. Please refer to FIG. 3, a conventional non-immersion type emitter is illustrated. The electrons emitted away from the cathode 301 will be accelerated to anode far away and will not close to the optical axis 300 because of no magnetic field. The virtual source 316 in this situation is less than that of the immersion type e-gun in FIG. 2. The virtual source 216 in FIG. 2 is enlarged, because every emitted electron in the ebeam 210 will be more converged parallel, or the electron beam 210 has lowered solid angle. This enlarged virtual source 216 through electronic optical devices will be projected on the specimen, and beam spot size at specimen surface is also enlarged, so the resolution is thus decreased.

This invention provides a charged particle source wherein the charged particle beam emitted away from an emitter is immersed in a maximum magnetic field immediately. Beam current density can be increased without enlarging virtual source, and hence high resolution can be provided at large beam current. In one embodiment of the invention, the charged particles are electrons, and can be applied to SEM or ebeam inspection tool.

The magnetic field at the tip of the emitter is the minimum of the field distribution, and preferred zero, and, along the optical axis, is maximum away from the tip immediately, such that most electrons can be condensed to the ebeam or primary beam. Hence, without the magnetic field, the electrons emitted away from the tip will not limit larger solid angle, and the virtual source thus will be smaller than that of conventional immersion type e-gun. A larger beam current can be available also because the magnetic field will converge electrons in the ebeam current after the electrons immediately leaves the tip. Therefore, a large beam current with high resolution electron source can be provided.

This invention also provides a SEM, which comprises an electron source, a column, and a detector. The electron source comprises a cathode for emitting electrons, a suppresser electrode encompassing the cathode for suppressing emitted electron distribution, an extraction electrode below the cathode for extracting electrons from the cathode, an accelerating electrode below the extraction electrode for accelerating the ebeam, a dual magnetic lens co-axial symmetrical to the optical axis and symmetric to the emitting plane. The dual magnetic lens will provide a magnetic field distribution that is minimum or zero at the tip of the cathode and along the optical axis largest immediately away from the tip. The column comprises a column aperture below the dual magnetic lens for selecting beam current, an auxiliary lens below the column aperture for condensing the ebeam, a detector for receiving signal electrons, an objective lens for focusing the ebeam on the specimen, a scanning unit for scanning the ebeam, and a retarding electrode for retarding and focusing energy of the ebeam. The objective lens, for example MOL (moving objective lens), VAL (varied axis lens), SOL (swing objective lens), or VAIL (varied axis immersion lens), may scan a large FOV. A vacuum tube may be applied to isolate the dual magnetic lens from the cathode, the suppresser electrode, the extraction electrode, and the column.

The emitted electrons keep high energy till the retard electrode, and are retarded by the retard electrode to a specific landing energy to the specimen. The landing energy is the voltage difference between specimen and the cathode.

The electron source provided by this invention can be operated at two modes. The first mode is the large beam current with high resolution when the dual magnetic lens provides an antisymmetric magnetic field at the tip of the cathode. Due to the anti-symmetric magnetic field at the tip, the magnetic field at the tip is zero and along the optical axis is largest away from the tip immediately. Large beam current and high resolution can be obtained simultaneously.

The second mode is low resolution but largest beam current. The dual magnetic lens can provide a magnetic field distribution with maximum at the tip of the cathode, which similar with conventional immersion type emitter. In this mode, largest beam current is provided and area of the virtual source is increased. However, for some kind of application, such as VC mode, defects can be identified at large enough beam current only. Thus, this invention can also provide VC mode inspection.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

Figure 4:
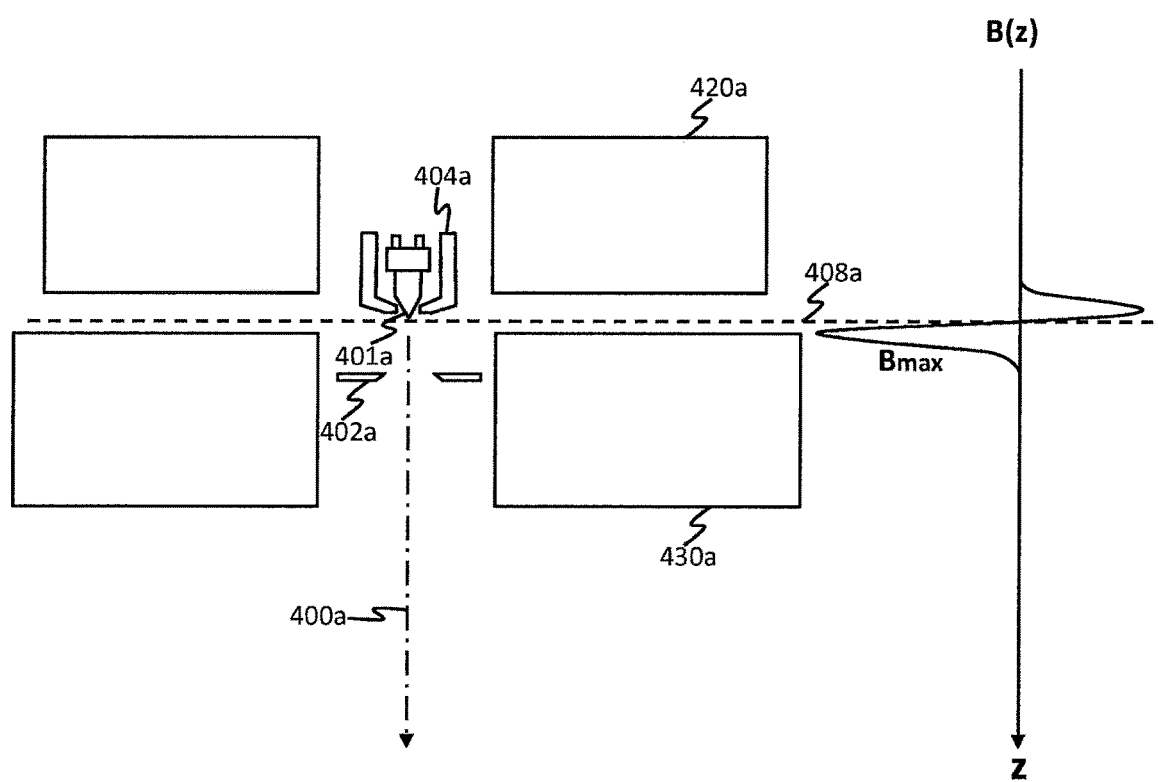
FIG. 4(a) to FIG. 4(d) are schematic illustrations of a charged particle source in accordance with several embodiments of the present invention.
Figure 4:
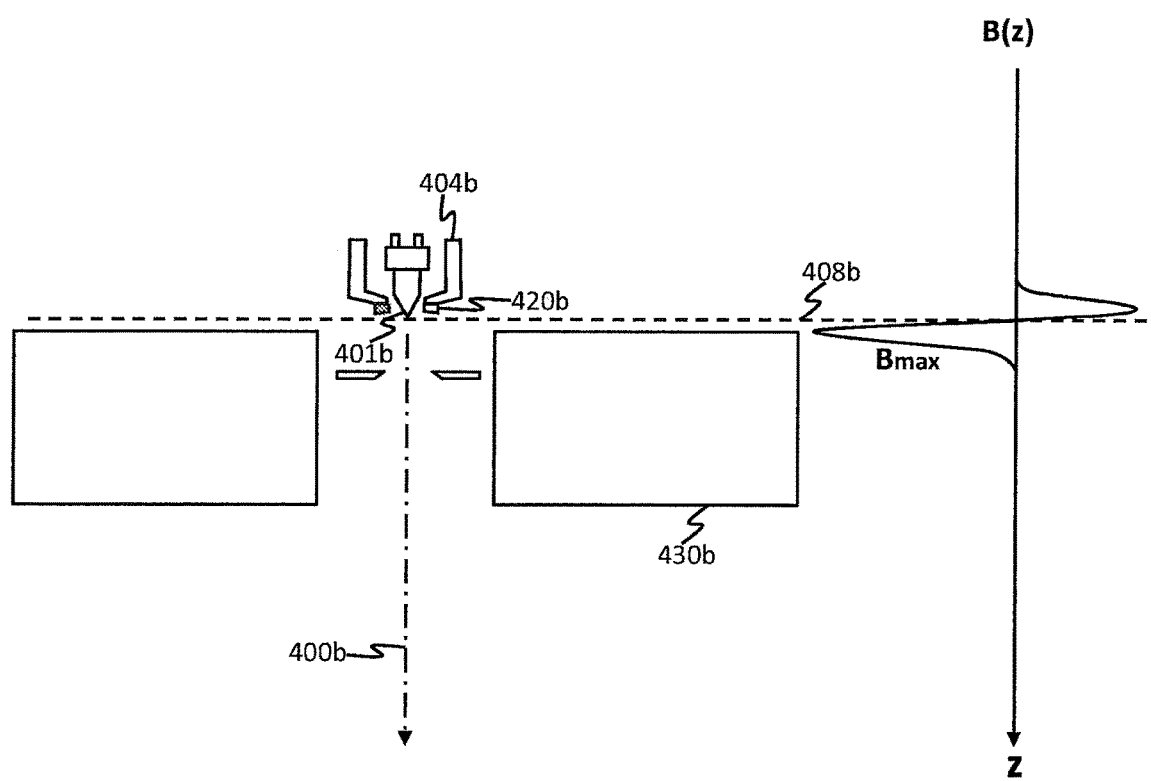
Figure 4:
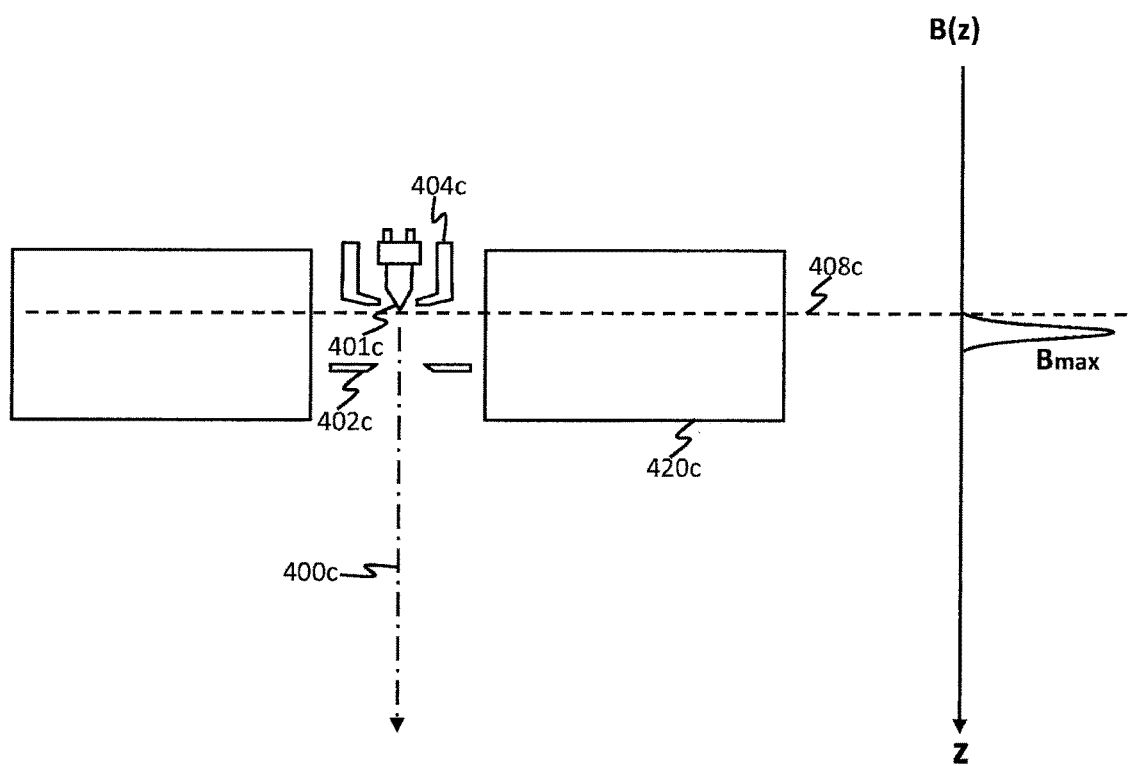
Figure 4:
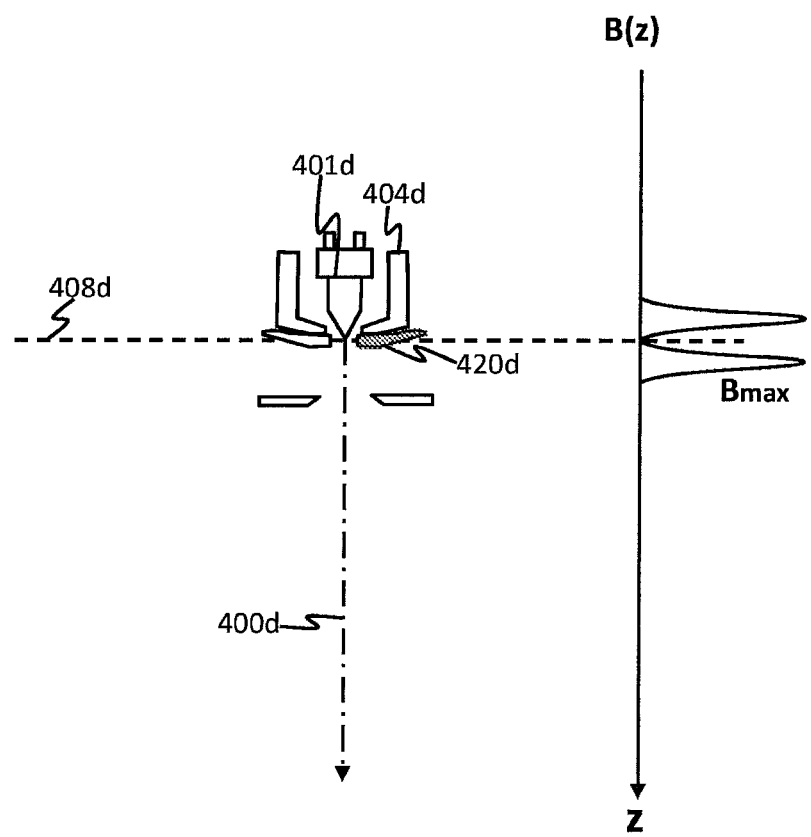

Please refer to FIG. 4(a), which is a first embodiment of this invention. This invention provides a dual magnetic lens 420a and 430a surrounding a cathode 401a along an optical axis 400a, a suppressor electrode 404a around the cathode 401a, and an extraction electrode 402a below the cathode 401a for extracting electrons from the cathode 401a. The dual magnetic lens 420a and 430a may be provided by permanent magnets, excitation coils, or combination thereof, which provides a magnetic field distribution along the optical axis. In this embodiment, the magnetic field distribution is not symmetric to a plane 408a through the tip of the cathode 401a. The dual magnetic lens 420a and 430a, in this embodiment is not symmetric to the plane 408a, but can be symmetric to the planes 408a. the magnetic lens 430a may be movable along the optical axis. The cathode 401a, being an emitter, can be thermion type, cold field type, or Schotty type.

The suppresser electrode 404a provides a negative electric field to suppress electrons from side of the cathode 401a from large solid angle ebeam distribution. The extraction electrode 402a assists electrons away from surface of the cathode 401a. The magnetic field distribution, in this embodiment, is zero or about to zero at the plane 408a, and hence the emitted electrons at the tip is not or less influenced by the magnetic field. The virtual source is thus small. And the emitted electrons, along the optical axis, away from the tip of the cathode 401a, are influenced by the maximum magnetic field Bmax, such that the ebeam is converged along the optical axis 400a. The magnetic field distribution can be adjusted by configuring excitations of the magnetic lens 420a or 430a, or by moving position of the magnetic lens 430a.

Please refer to FIG. 4(b), a second embodiment of this invention is provided, wherein a permanent magnet 420b is applied to replace the magnetic lens 420a. The low magnetic lens 430b can provide a magnetic field by a permanent magnet or an excitation coil. The superposed magnetic field distribution, by the dual magnetic lens 420b and 430b along the optical axis, will be zero or about zero at the plane 408b and maximum Bmax immediately away from the tip of the cathode 401b.

Please refer to FIG. 4(c), a third embodiment of this invention is provided. It is provided a single magnetic lens 420c surrounding a cathode 401c along the optical axis 400c, a suppresser electrode 404c around the cathode 401c, and an extraction electrode 402c below the cathode 401c. The magnetic lens 420c provides a single-pole like magnetic field along the optical axis by a permanent magnet or an excitation coil. The magnetic field distribution is minimum, about zero, or preferred zero at the plane 408c. The cathode 401c, being an emitter, can be thermion type, cold field type, or Schotty type.

Please refer to FIG. 4(d), a fourth embodiment of this invention is provided. A permanent magnet is applied to the magnetic lens 420d, which can provide a magnetic field distribution illustrated in the right hand side of the FIG. 4(d). This kind of permanent magnet may be configured by two circular magnets sandwiching none magnet layer. The magnetic field distribution is minimum, about zero, or preferred zero at the plane 408d, and maximum Bmax away from the tip of the cathode 401c along the optical axis 400d.

Theoretical analysis for motions of the emitted electrons will be discussed hereinafter. Under the nonrelativistic condition, the emitted electrons at conserved rotational symmetric electromagnetic field can be described by cylindrical coordinate system (z, r, φ):

$$\frac{d}{dt}(m_0 r^2 \dot{\phi} + erA) = 0 \quad (1)$$

Integrate the formula (1) by time, an angular momentum equation is obtained:

$$m_0 r^2 \dot{\phi} + erA = m_0 r_0^2 \dot{\phi}_0 + er_0 A_0 = -eC \quad (2)$$

wherein e is the electron charge, $m_o$ is static mass of the electron, C is the initial canonical angular momentum, and $r_0$, $A_0$, and $\dot{\phi}_0$, are initial position, initial magnetic vector potential, and initial angular velocity of the electron. The angular velocity and angular momentum can be obtained:

$$\dot{\phi} = -\frac{e}{m_0}\left(\frac{rA}{r^2} + \frac{C}{r^2}\right) \quad (3)$$

$$C = -\frac{m_0}{e}r_0^2 \dot{\phi}_0 - r_0 A_0 \quad (4)$$

From formula (4), in conventional immersion type emitter, the initial magnetic vector potential $A_0$ is not zero, and the initial canonical angular momentum is not zero, even that the initial angular velocity $\dot{\phi}_0$ of the electron can be neglected. Hence, one electron at off-axis will be emitted with the angular velocity $\dot{\phi}_0$ in formula (3) around the off-axis magnetic force line, or the local magnetic force line in solenoidal motion, wherein the off-axis magnetic force line is the initial magnetic vector potential $A_0$. Further, due to the maximum magnetic field is at the tip of the emitter, magnetic force line density is maxima at the tip along the optical axis, such that electrons will converge to the optical axis. On the other hand, if there is no magnetic field at the tip, i.e. non-immersion type emitter, because there is no off-axis magnetic force line, the initial canonical angular momentum C is zero, and the electrons will be emitted from the cathode radially.

The aberration incurred is discussed hereinafter. Beam spot size can be obtained:

$$D = \sqrt{D_i^2 + D_s^2 + D_c^2 + D_d^2 + D_e^2} \quad (5)$$

$$D_i = M \cdot D_0 \quad (6)$$

$$D_s = \frac{1}{4}C_s \cdot \alpha^3 \quad (7)$$

$$D_c = \frac{1}{2}C_c \cdot \alpha \cdot \frac{\Delta v}{V_0} \quad (8)$$

$$D_d = 0.61 \cdot \frac{\lambda}{\alpha} \quad (9)$$

$$D_e \propto \frac{1}{V^n}, 0 < n < 1 \quad (10)$$

wherein D is the diameter of the beam spot, $D_i$ is the geometric image diameter of source, $D_s$ is the diameter of spherical aberration, $D_c$ is chromatic aberration, $D_d$ is the diameter of the diffraction on disc aberration, and $D_e$ is aberration diameter by Coulomb effect. And, $D_0$ is the diameter of the virtual source, M is the magnification, $C_s$ and $C_c$ are the coefficients of spherical aberration and chromatic aberration respectively, $V_0$ and $\Delta v$ are landing energy and energy distribution respectively, α is solid angle of the ebeam on the specimen, λ is the De Broglie wavelength of the electron, and V is the energy difference from the tip to the specimen.

From the formula (5) and (6), diameter of the virtual source $D_0$ will impact resolution; that is larger area of the virtual source will incur lower resolution. Hence in this invention an immersion-like electron source can be provided with high resolution by keeping area of the virtual source small. Aberration is thus improved at large beam current.

Figure 5:
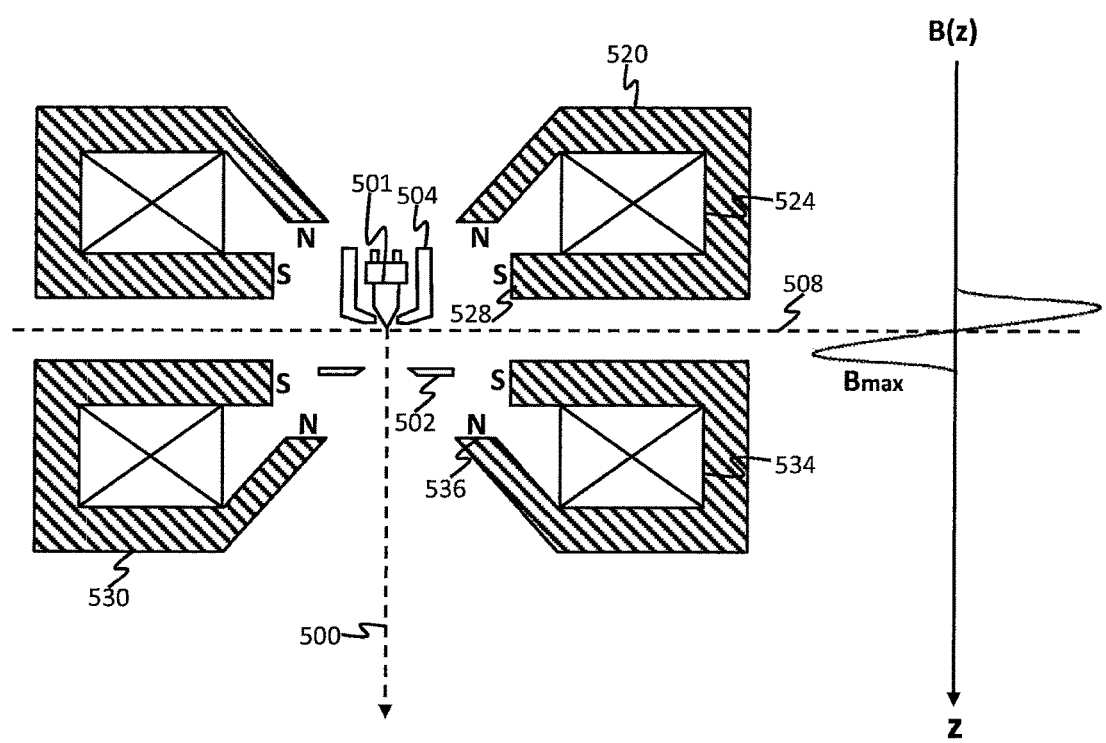
FIG. 5 is a schematic illustration of a charged particle source inside dual magnetic lens with anti-symmetric magnetic field distribution in accordance with one embodiment of the present invention.

Please refer to FIG. 5, a fifth embodiment of the invention is provided. This embodiment provides the first operation mode; that is high resolution at large beam current. Equal but opposite directional excitation currents are provided to the excitation coils 524 and 534 respectively in the dual magnetic lens 520 and 530. Thus, along the optical axis 500, an anti-symmetric magnetic field distribution at the plane 508 is thus obtained, and this anti-symmetric magnetic field distribution is the superposed magnetic field by the magnetic fields provided by the dual magnetic lens 520 and 530. The magnetic field is zero at the plane 508 along the optical axis 500, and maximum Bmax away from the tip of the cathode 501 immediately.

Figure 6:
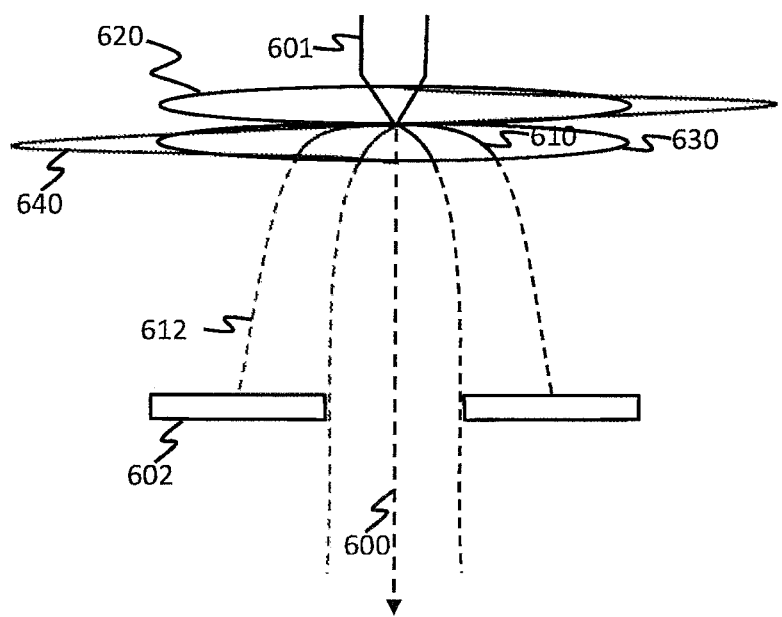
FIG. 6 shows electron optical illustration of electrons emitted from the cathode under the anti-symmetric magnetic field distribution with an embodiment as shown in FIG. 5.

FIG. 6 illustrates motions of electrons influenced under electron optics in this invention at the first mode. The magnetic fields 620 and 630 are generated by the dual magnetic lens 520 and 530 respectively, and are superposed to the magnetic field distribution 640. Because the magnetic fields 620 and 630 are anti-symmetric to the tip of the cathode 601, the magnetic field distribution 640 is zero at the tip and maximum away from the tip immediately along the optical axis 600. The electrons thus extracted by the extraction electrode 602 are emitted from the tip of the cathode 601 without any magnetic force, and hence a large solid angle can be obtained to reduce area of virtual source. And the electrons away from the tip immediately will suffer a maximum magnetic field, and converged to the optical axis 600 to form a large beam current. The magnetic field distribution 640 is a round lens with small spherical aberration. When the electrons 612 with large horizontal velocity will be blocked by the extraction electrode 602. The energy distribution of the ebeam is limited to lower the chromatic aberration.

Figure 7:
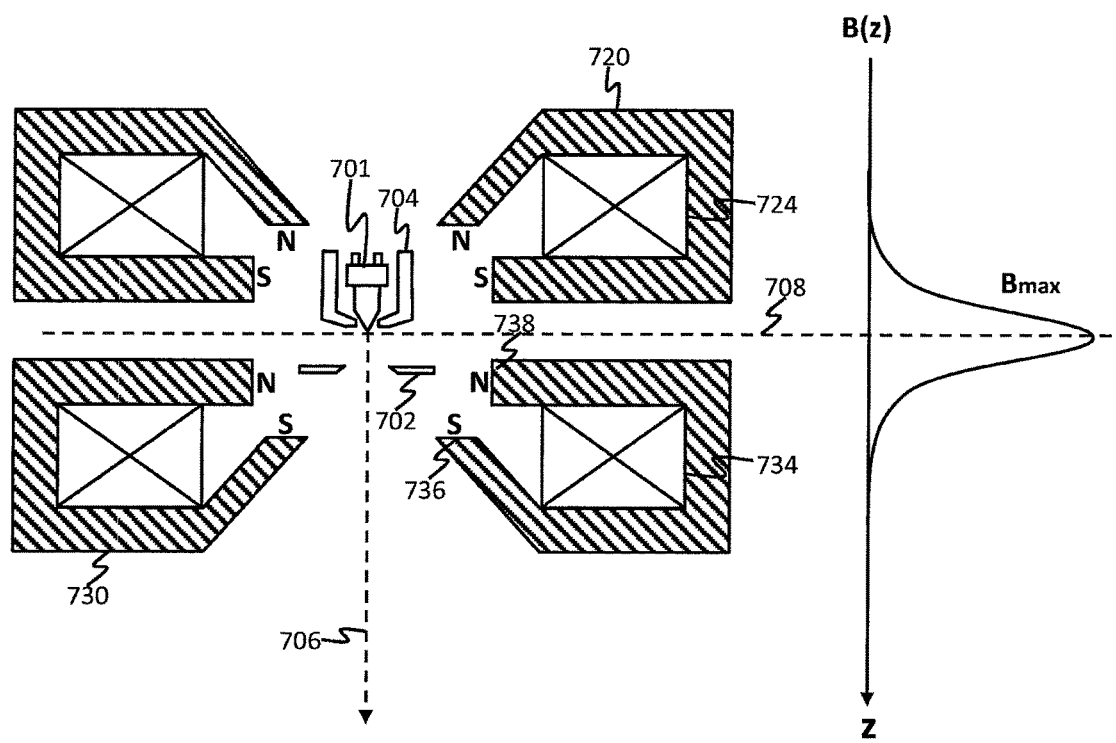
FIG. 7 is a schematic illustration of a charged particle source inside dual magnetic lens with symmetric magnetic field distribution in accordance with one embodiment of the present invention.

Please refer to FIG. 7, a sixth embodiment of this invention is provided. This embodiment provides a second operation mode; that is low resolution and largest beam current. Equal and same directional excitation currents are provided to the excitation coils 724 and 734 respectively in the dual magnetic lens 720 and 730. Thus, along the optical axis 700, a magnetic field distribution at the plane 708 is largest, and this magnetic field distribution is the superposed magnetic field by the magnetic fields provided by the dual magnetic lens 720 and 730. The magnetic field is maxima at the plane 708 and symmetric to the plane 708 along the optical axis 500. The cathode 701 in this embodiment is completely immersed to the magnetic field distribution.

Figure 8:
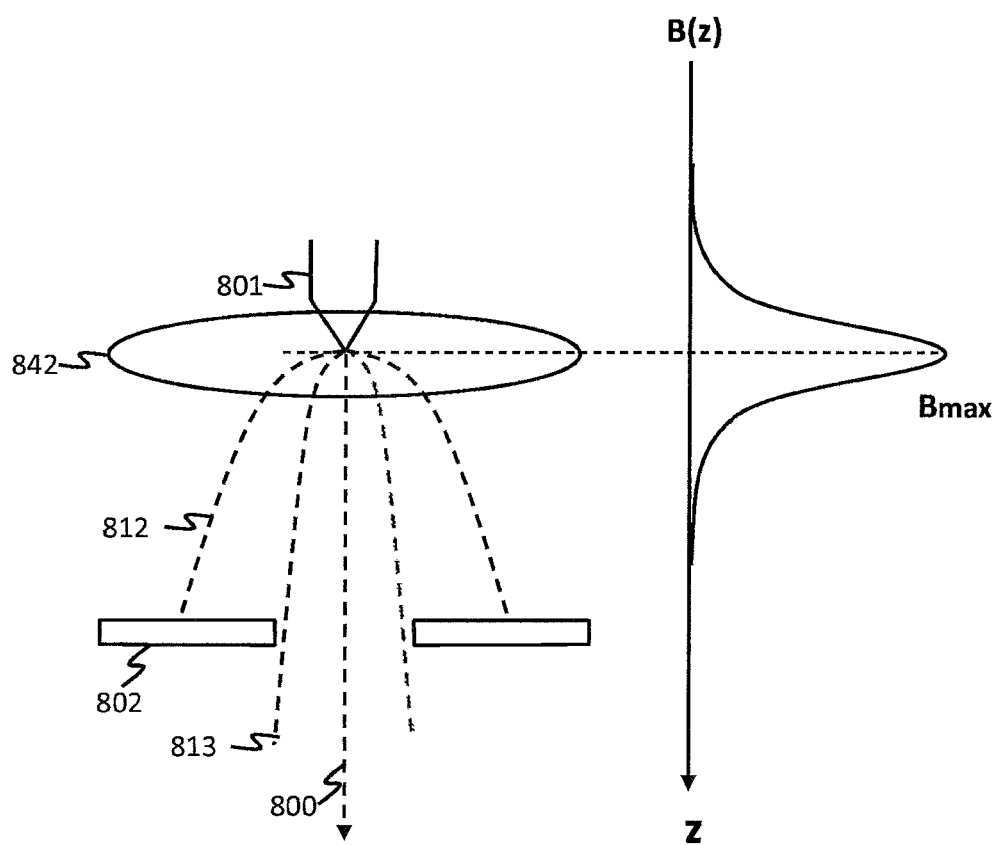
FIG. 8 shows electron optical illustration of electrons emitted from the cathode under the anti-symmetric magnetic field distribution with an embodiment as shown in FIG. 7.

FIG. 8 illustrates motions of electrons influenced under electron optics in the invention at the second mode. The magnetic field distribution 842 is simply superposed to have a largest magnetic field at the tip of the cathode 801. In this embodiment, all electrons emitted from the tip will be converged and the largest beam current can be provided similar to conventional immersion type emitter. If largest beam current is considered only, this invention can also provide this operation mode.

Figure 9:
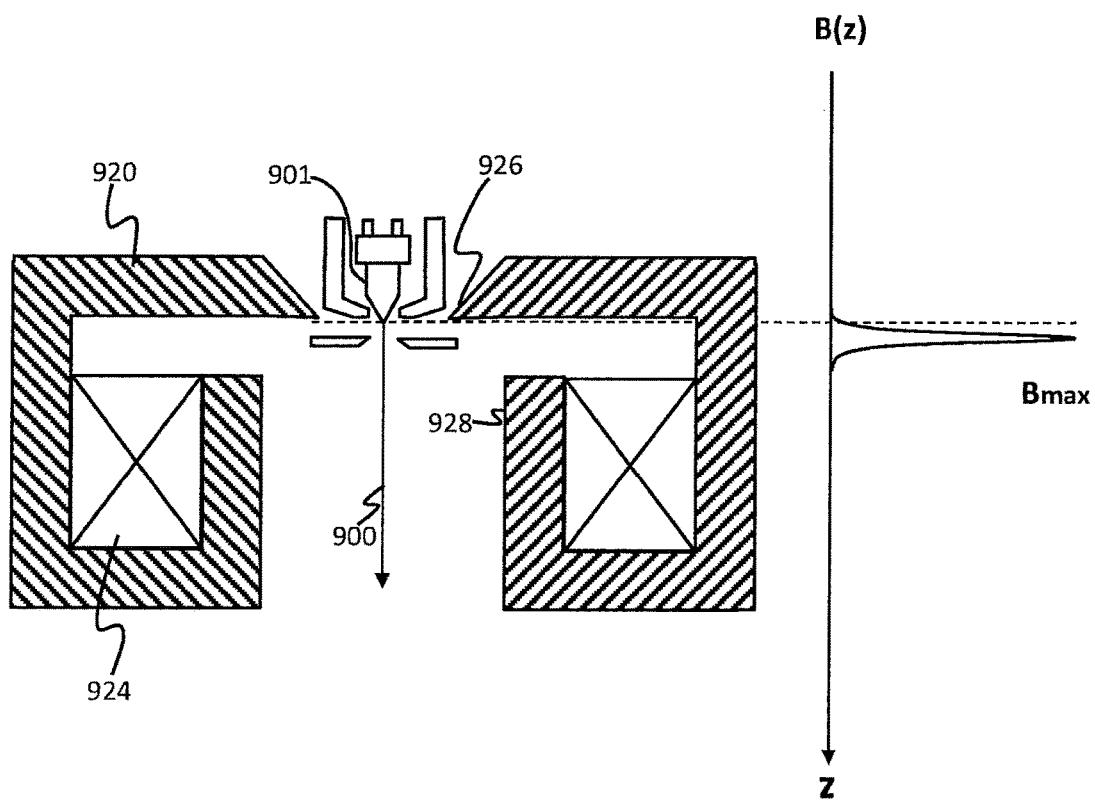
FIG. 9 is a schematic illustration of a charged particle source inside a magnetic lens with magnetic monopole-like field distribution in accordance with one embodiment of the present invention.

Please refer to FIG. 9, wherein a seventh embodiment of this invention is provided. The magnetic lens 920 comprises an excitation coil 924 which is enclosed by a yoke. The yoke has an opening constitutes the upper pole piece 926 and lower pole piece 928 for generating magnetic force line when the excitation coil 924 is excited by a current. In this embodiment, the lower pole piece 928 is far away from the tip of the cathode 901, while the upper pole piece 926 is close to the tip of the cathode 901. The upper pole piece 926 thus provides a magnetic monopole-like field near the tip of the cathode 901. The magnetic monopole-like field distribution along the optical axis 900, illustrated at the right hind side of the FIG. 9, has a minimum at the tip of the cathode 901 and maximum immediately away from the tip along the optical axis 900.

Figure 10:
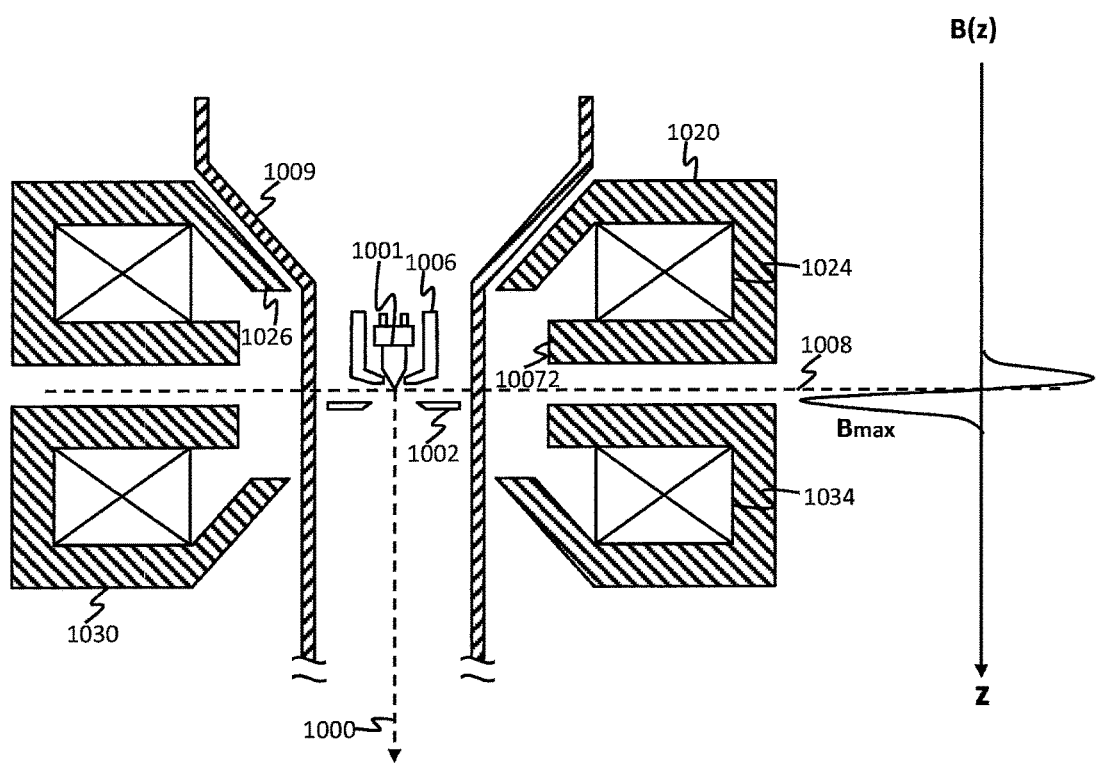
FIG. 10 is a schematic illustration of a charged particle source with a vacuum tube configured between the cathode and the dual magnetic lens in accordance with one embodiment of the present invention.

Please refer to FIG. 10, wherein an eighth embodiment of this invention is provided. A vacuum tube 1009 is configured to enclose the cathode 1001, the suppresser electrode 1006, and the extraction electrode 1002, such that high vacuum can be provided at the tip of the cathode 1001. The vacuum tube 1009 is composed of non-magnetic conductive material, and the magnetic field distribution provided by the dual magnetic lens 1020 and 1030 located outside of the vacuum tube 1009 may penetrate through the vacuum tube 1009.

Figure 11:
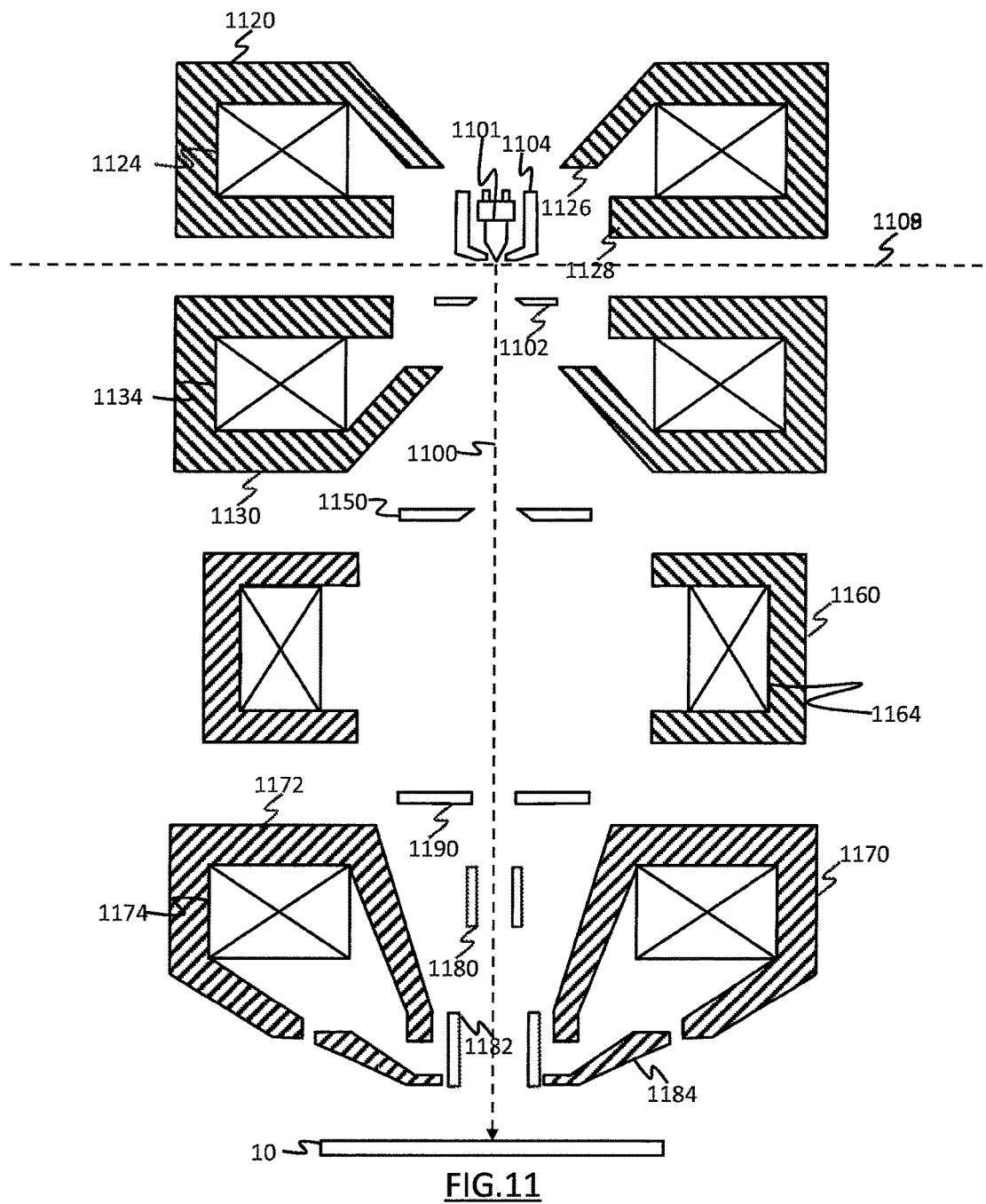
FIG. 11 is a schematic illustration of a SEM with the electron source in accordance with one embodiment of the present invention.

Please refer to FIG. 11, wherein a ninth embodiment of this invention is provided. This embodiment provides a SEM with the electron source mentioned above and a column. The electron source includes a cathode 1101 for emitting electrons, a suppresser electrode 1104 around the cathode 1101 for suppressing electrons emitted from side of the cathode 1101, an extraction electrode 1102 below the cathode 1101 for extracting electrons from the cathode 1101, and a dual magnetic lens 1120 and 1130 for providing magnetic field distribution along the optical axis 1100. The column includes an beam current plate 1150 below the dual magnetic lens 1120 and 1130 for adjusting beam current, an auxiliary lens 1160 below the beam current plate 1150 for adjusting image half angle on the specimen 10, an objective lens 1170 above the specimen 10 for focusing the ebeam on the specimen 10, a deflection unit 1180 and 1182 inside the objective lens 1170 for scanning the ebeam, a retard electrode 1184 between the objective lens 1170 and the specimen 10 for providing a retarding force to the ebeam, and a detector 1190 for receiving signal electrons emanated from the specimen.

The beam current plate 1150 may have several apertures for trimming beam to obtain a selective beam current. The auxiliary lens 1160 can vary different image half angle at the same beam current. The auxiliary lens 1160 is also a magnetic lens provided by the excitation coil 1164 and encompassed by the yoke with an opening. The objective lens 1170, in this invention, prefers a system which can scan large FOV. In one embodiment, SORIL (swing object retarding immersion lens) is preferred. The detector 1190, in this embodiment, is located above the objective lens 1170, but can be located at other positions. The signal electrons may be secondary electrons or backscatter electrons.

The dual magnetic lens 1120 and 1130 may be operated at two modes. When the electron source provides large beam current with high resolution, the SEM in FIG. 11 can operate high resolution inspection when the electron source provides the largest beam current with low resolution, it can operate VC inspection to identify defects.

One prior art, provided by Kenich Saito et at and titled to "A new design for a field emission electron gun immersed in a magnetic-lens field", recites an immersion type e-gun, which includes a magnetic lens generating a magnetic field immersing the tip of an emitter, or the cathode. The emitter is located near the lower pole piece and immersed most magnetic fields.

Another prior art, provided by Frosien et al. and entitled to U.S. Pat. No. 5,895,919, recites an emitter, an extraction electrode and an accelerating electrode immersed in a magnetic field.

Another prior art, provided by Miyoshi et al. and entitled to U.S. Pat. No. 5,371,371, recites an immersion type emitter with a movable magnetic lens.

Another prior art, provided by Veneklasen et al. and entitled to U.S. Pat. No. 6,392,333, recites an immersed magnetic lens with a permanent magnet fastened to a suppresser electrode. Another prior art, provided by Yasuda et al. and entitled to US publication number 2010/0,019,648, recites an e-gun and lithographic tool, wherein an immersion type emitter is provided.

Another prior art, provided by Jiang et al. and entitled to U.S. Pat. No. 7,821,187, recites an immersion type emitter which can provide variant beam currents and variant resolutions.

Compared to this invention, the prior arts mentioned above only configures one magnetic lens to immerse the emitter, and lower resolution is incurred.

Still another prior art, provided by Zhang et al. and entitled to U.S. Pat. No. 7,893,406, recites an immersion type emitter by dual magnetic lens, in which one is an immersion lens for pre-condensing and the other is non-immersion lens for condensing ebeam. Beam spot size and beam current can be adjusted more flexible. Compared to this invention, the emitter is still immersed in the magnetic field with lower resolution.

In summary, the present invention provides a charged particle source which can be operated at two modes. The charged particle source includes an emitter for emitting charged particle beam, and means for generating a magnetic field distribution which is minimum or zero at the tip of the emitter and maximum immediately away from the tip along the optical axis. The magnetic field distribution, in a preferred embodiment, can be provided by dual magnetic lens. When the dual magnetic lens provides anti-symmetric magnetic field at the tip of the emitter, a large beam current with high resolution can be provided. When the dual magnetic lens provides symmetric magnetic field at the tip of the emitter, a largest beam current, as in the prior art, can be provided also for some specific applications.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing an electron beam from an electron beam inspection tool, comprising:
   emitting an electron beam along an optical axis from a tip of an emitter;
   generating a first magnetic field with a first magnetic lens located above the tip of the emitter; and
   generating a second magnetic field with a second magnetic lens located below the tip of the emitter, wherein, upon the generation of the first magnetic field and the second magnetic field, the first magnetic field and the second magnetic field are superposed to provide a superposed magnetic field distribution to influence the electron beam based on an operation mode of the electron beam inspection tool.

2. The method of claim 1, wherein the tip of the emitter is a portion of the emitter from which electrons are emitted to form the electron beam.

3. The method of claim 1, wherein the first magnetic lens is located above an emitting plane of the emitter and wherein the second magnetic lens is located below the emitting plane of the emitter.

4. The method of claim 3, wherein the first magnetic lens includes a first excitation coil and the second magnetic lens includes a second excitation coil.

5. The method of claim 4, further comprising:
   applying a first excitation current to the first excitation coil; and
   applying a second excitation current to the second excitation coil, wherein the first excitation current and the second excitation current are the same in amount but opposite in direction.

6. The method of claim 5, wherein the superposed magnetic field distribution is anti-symmetric relative to the tip of the emitter.

7. The method of claim 6, wherein the superposed magnetic field distribution is weakest at the tip of the emitter and strongest between the tip of the emitter and an extraction electrode.

8. The method of claim 7, wherein the weakest magnetic field distribution at the tip of the emitter is zero.

9. The method of claim 8, wherein the superposed magnetic field distribution provides a high-resolution operation mode.

10. The method of claim 4, further comprising:
    applying a first excitation current to the first excitation coil; and
    applying a second excitation current to the second excitation coil, wherein the first excitation current and the second excitation current are the same in amount and in direction.

11. The method of claim 10, wherein the superposed magnetic field distribution is symmetric relative to the tip of the emitter in the high throughput mode.

12. The method of claim 11, wherein the superposed magnetic field distribution is strongest at the tip of the emitter.

13. The method of claim 12, wherein the superposed magnetic field distribution provides a high-throughput operation mode.

* * * * *